United States Patent

Gris et al.

[11] Patent Number: 5,414,400
[45] Date of Patent: May 9, 1995

[54] ROGOWSKI COIL

[75] Inventors: Jean-Paul Gris; Jean-Pierre Dupraz, both of Lyons, France

[73] Assignee: GEC Alsthom T&D SA, Paris, France

[21] Appl. No.: 67,628

[22] Filed: May 28, 1993

[30] Foreign Application Priority Data

Jun. 5, 1992 [FR] France ................................ 92 06859

[51] Int. Cl.⁶ ........................ H01F 27/28; H01F 40/00
[52] U.S. Cl. ................................ 336/174; 336/200; 336/225
[58] Field of Search ................ 336/200, 225, 232, 123, 336/173, 174

[56] References Cited

U.S. PATENT DOCUMENTS

| 2,970,238 | 1/1961 | Swiggett | 336/200 |
| 3,023,335 | 2/1962 | Burr | 336/200 |
| 3,050,650 | 8/1962 | Henry-Baudot | 336/200 |
| 3,668,587 | 6/1972 | Foster | 336/123 |
| 4,253,079 | 2/1981 | Brosh | 336/200 |
| 4,803,425 | 2/1989 | Swanberg | 336/200 |
| 5,055,816 | 10/1991 | Altman et al. | |

FOREIGN PATENT DOCUMENTS

| 3712190 | 10/1988 | Germany . | |
| 3-283404 | 12/1991 | Japan | 336/200 |
| 665303 | 4/1988 | Switzerland . | |
| 2163603 | 2/1986 | United Kingdom | 336/200 |

*Primary Examiner*—Thomas J. Kozma
*Attorney, Agent, or Firm*—Sughrue, Mion, Zinn, Macpeak & Seas

[57] ABSTRACT

A Rogowski coil comprising at least one printed circuit plate provided with a circular cutout, the coil being implemented by rectilinear metal deposits on each of the two faces of the plate and extending along radii such that geometrical projections thereof intersect in the center of said cutout, electrical connections between the radii on one face and those on the opposite face being implemented by plated through holes that pass through the thickness of the plate.

10 Claims, 2 Drawing Sheets

ROGOWSKI COIL

The present invention relates to a Rogowski coil.

BACKGROUND OF THE INVENTION

The term "Rogowski coil", sometimes also known as a "Rogowski torus", conventionally designates a conductor winding coiled on a toroidal former made of non-ferromagnetic material, thereby conferring characteristics of excellent linearity on the coil because of the absence of saturation.

A Rogowski coil is particularly suitable for use in measuring the magnitude of current at mains frequency.

To do this, the coil is loaded with a resistor R of high resistance.

The voltage picked up across the terminals of the coil is an image of the derivative of the current, providing that $R^2$ is much greater than $r^2+L\omega^2$ where r designates the resistance of the coil, L designates its self-induction, and $\omega$ is the angular frequency of the current to be measured.

An image of the primary current can then be obtained merely by integrating said voltage.

One of the difficulties encountered in measuring current by means of a conventional type of Rogowski coil results from the way the parameters of the coil vary with temperature, thereby giving rise to large errors of measurement.

Another difficulty comes from the fact that it is difficult to make a conventional type of coil that is perfectly symmetrical, axially; unfortunately, if the coil is not perfectly symmetrical, then the measurement depends on the position of the conductor passing through the torus and also on its orientation.

Axial symmetry requires, at least, that the winding be constituted by at least a double (go-and-return) winding which is technically difficult if not impossible to achieve when winding wire around a torus and which, in any event, ensures that a coil made in this way is very expensive.

OBJECTS AND SUMMARY OF THE INVENTION

An object of the invention is to implement a Rogowski coil having low sensitivity to variations in temperature.

Another object of the invention is to implement a coil whose axial symmetry is substantially perfect.

Another object of the invention is to provide a Rogowski coil at a relatively low cost price.

The present invention satisfies the above objects by providing a Rogowski coil comprising at least one printed circuit plate provided with a circular cutout, the coil being implemented by rectilinear metal deposits on each of the two faces of the plate and extending along radii such that geometrical projections thereof intersect in the center of said cutout, electrical connections between the radii on one face and those on the opposite face being implemented by plated through holes that pass through the thickness of the plate.

In a preferred embodiment, the coil is constituted by the radially-extending portions and by the holes, including a go path and a return path disposed around the circular cutout, with an inlet and an outlet on the same face of the plate, said inlet and outlet being separated by a distance of a few tenths of a millimeter.

In a particular embodiment, the coil includes a plurality of plates, disposed parallel to one another and secured together, said coils being connected in series by electrical connections perpendicular to the plates.

In a particular embodiment of the multi-plate coil, the plates are square, the inlet and outlet connections between the various plates being connected in one of the corners of the square, of the same side of the corresponding plate, each of the plates including a cutout in the above-mentioned corner, with the side of the cutout varying from one plate to the adjacent plate.

Advantageously, one of the plates caries an electronic circuit for processing the signals induced in the coil.

BRIEF DESCRIPTION OF THE DRAWINGS

The invention will be well understood on reading the following description of a particular embodiment of the invention given with reference to the accompanying drawings, in which.

MORE DETAILED DESCRIPTION

Figure 1:
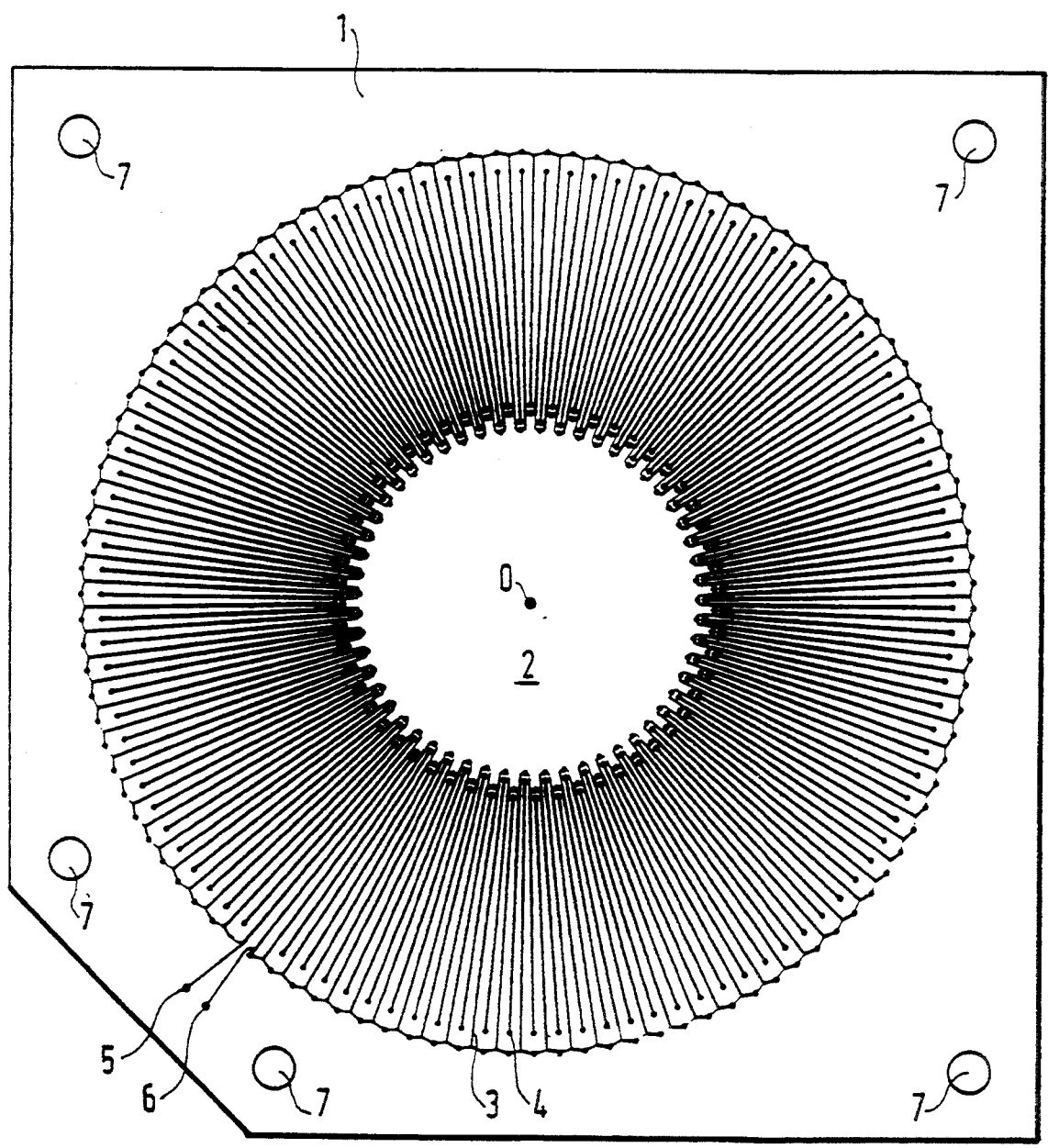
FIG. 1 is a plan view of a Rogowski coil of the invention.

FIG. 1 is a plan view of a Rogowski coil of the invention.

It comprises a double-sided printed circuit plate preferably made of epoxy resin that is preferably filled with stratified glass, so as to have a low coefficient of thermal expansion. In a variant, the plate is made of a ceramic or of any other analogous material having a very low expansion coefficient.

The thickness of the plate is advantageously equal to 1.6 mm.

The preferably square plate includes a central hole 2 for receiving the cable whose current is to be measured.

The coil is constituted by deposits of copper such as 3 which are disposed on each of the faces of the plate. These deposits are rectilinear and radial, i.e. geometrical projections thereof intersect at the center 0 of the plate. As described below, the deposits on one of the faces are connected to the deposits on the opposite face via plated-through holes 4 passing through the plate.

The deposition surface is chemically stabilized by a deposit of gold to a controlled thickness, thereby controlling the internal resistance of the Rogowski coil.

The person skilled in the art knows how to replace gold by other suitable deposits and how to protect such deposits by appropriate techniques, e.g. by protective varnishes.

FIG. 1 shows the inlet 5 and the outlet 6 of the coil which are a few tenths of a millimeter apart, thereby maintaining axial symmetry of the coil.

References 7 designate holes for fixing the plate to other plates in order to build up a multi-plate Rogowski coil.

Figure 2:
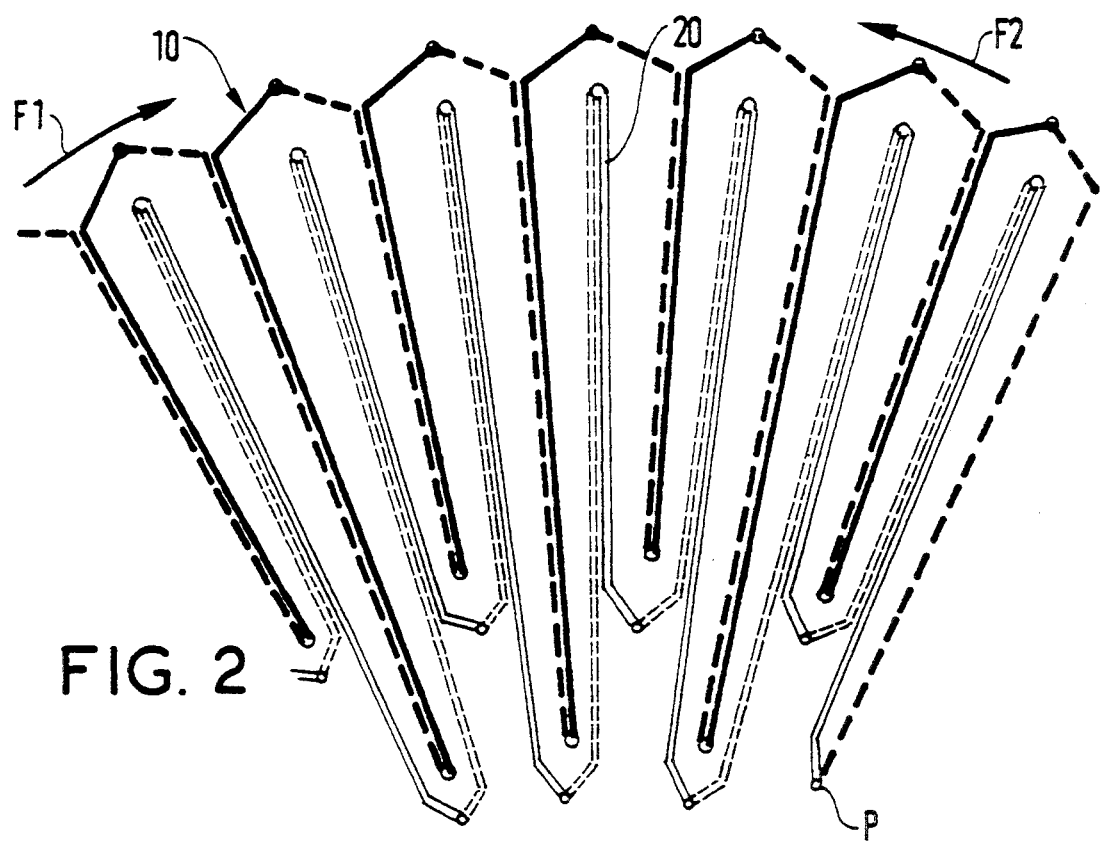
FIG. 2 is a diagram explaining how the coil of the invention is coiled.

FIG. 2 is a diagram explaining how the coil is organized. In order to maintain perfect axial symmetry, the coil is built up from two windings in series, a "first" winding 10 is wound clockwise while a "second" winding 20 is wound anticlockwise. FIG. 2 is a diagrammatic plan view of a portion of said coil and the following conventions have been used: the first winding 10 is shown in continuous thick lines wherever the deposit is on the visible face of the plate, and in dashed thick lines wherever the deposit is on the other face; the second winding 20 is represented by a continuous pair of lines or by a dashed pair of lines depending on whether the deposit is on the visible face or on the opposite face. To make the drawing understandable, the two radially-extending portions of the same turn are shown as being side by side, but it should be understood that, in fact, these two radially-extending portions lie exactly one over the other on the two opposite faces of the plate. Arrow F1 shows the winding direction of the first winding, while arrow F2 shows the winding direction of the other winding. Point P is the point where the windings 10 and 20 are connected in series.

Figure 3:
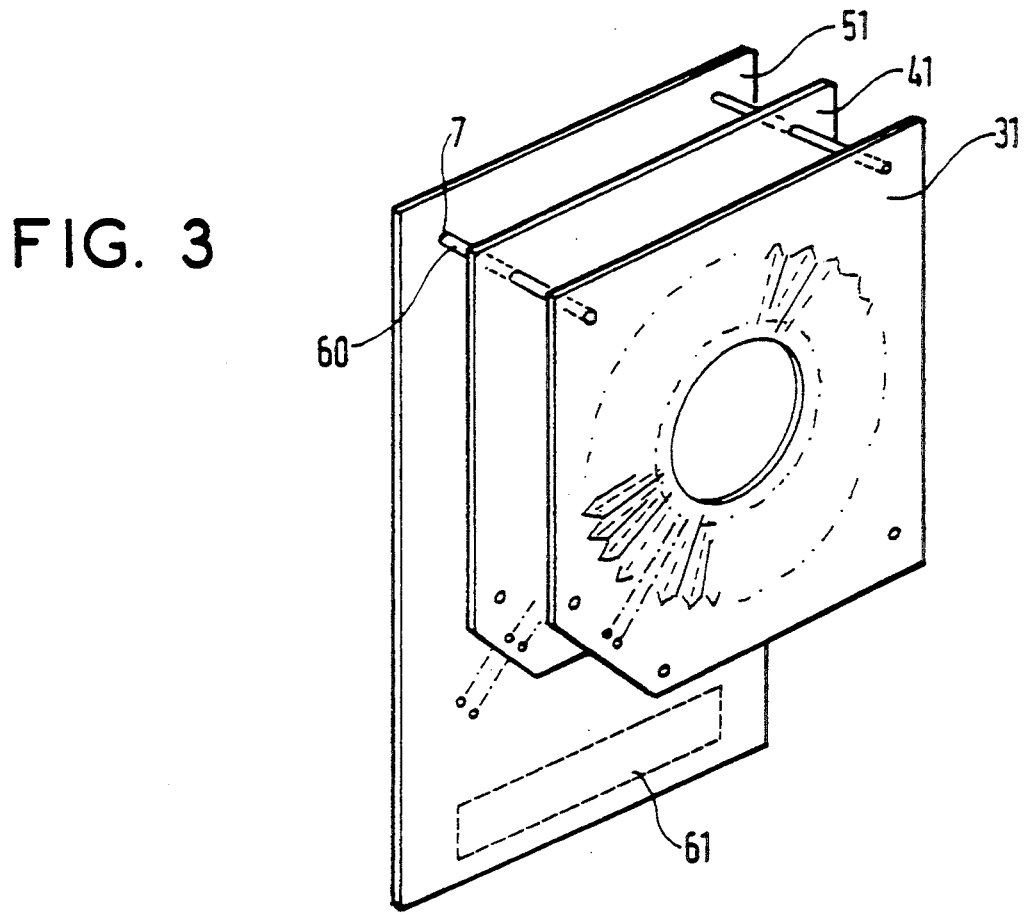
FIG. 3 is a perspective view of a Rogowski coil having two active plates and one terminal plate.

A plate of the size shown in FIG. 1 may have about 250 turns; it is possible to increase the sensitivity of the coil by using a plurality of cards of the type shown in FIG. 1. FIG. 3 shows a coil that comprises three coil cards 31, 41, and 51 which are disposed parallel to one another and which are held together by tie bars 60 passing through the holes 7. The cards 31 and 41 include triangular cutouts of different sizes so as to facilitate interconnecting the coils by means of conductors (not shown) that pass through the plates perpendicularly to their plane.

The plate 51 does not include a cutout and, in the example shown in FIG. 3 is it rectangular, serving to carry the electronic circuit that processes the signals induced in the Rogowski coil, said circuit being represented by rectangular outline 61. As a result, connections are very short and they do not give rise to interfering signals. It may be observed that the output signals are made using tracks (metal deposits) that are situated on the same side of a plate so as to minimize the influence of the magnetic field created by the current to be measured.

The invention can be implemented cheaply. It enables high measurement accuracy to be obtained since, by using epoxy resin, changes in the resistance of the coil with temperature are very small, being of the order of one part in 80,000 per °C.

This also makes it possible to check on the quality of the deposit merely by measuring the resistance of the coil.

We claim:

1. A Rogowski coil in combination with a wire, said coil being provided for measuring a current in said wire comprising at least one printed circuit plate provided with a circular cutout, the coil being implemented by rectilinear metal deposits on each of the two faces of the plate and extending along radii such that geometrical projections thereof intersect in the center of said cutout, electrical connections between the radii on one face and those on the opposite face being implemented by plated through holes that pass through the thickness of the plate, wherein the coil is constituted by the radially-extending portions and by the holes, including a go path and a return path disposed around the circular cutout, with an inlet and an outlet on the same face of the plate, said inlet and outlet being separated by a distance of a few tenths of a millimeter, and wherein the wire extends through said cutout.

2. A Rogowski coil in combination with a wire according to claim 1, including a plurality of plates, disposed parallel to one another and secured together, said coils being connected in series by electrical connections perpendicular to the plates.

3. A Rogowski coil in combination with a wire according to claim 2, wherein the plates are square, the inlet and outlet connections between the various plates being connected in one of the corners of the square, of the same side of the corresponding plate, each of the plates including a cutout in the above-mentioned corner, with the side of the cutout varying from one plate to the adjacent plate.

4. A Rogowski coil in combination with a wire according to claim 2, wherein one of the plates caries an electronic circuit for processing the signals induced in the coil.

5. A Rogowski coil in combination with a wire according to claim 1, wherein the material of the plate is epoxy resin.

6. A Rogowski coil in combination with a wire according to claim 5, wherein the resin is filled with stratified glass.

7. A Rogowski coil in combination with a wire according to claim 1, wherein the plate material is a material having a very low coefficient of thermal expansion.

8. A Rogowski coil in combination with a wire according to claim 1, wherein the metal deposit is chemically stabilized by a metal deposit.

9. A Rogowski coil in combination with a wire according to claim 1, wherein the printed circuit receives protective treatment by means of a protective varnish.

10. A Rogowski coil in combination with a wire according to claim 1, wherein the go path and the return path are arranged to have substantially perfect axial symmetry such that said Rogowski coil measures a same current independent of a location and orientation of the wire extending through the cutout.

* * * * *